United States Patent
Cottle et al.

(10) Patent No.: US 9,810,980 B1
(45) Date of Patent: *Nov. 7, 2017

(54) GRAPHOEPITAXY DIRECTED SELF ASSEMBLY

(71) Applicants: INTERNATIONAL BUSINESS MACHINES CORPORATION, Armonk, NY (US); TOKYO ELECTRON LIMITED, Tokyo (JP)

(72) Inventors: Hongyun Cottle, Schenectady, NY (US); Cheng Chi, Jersey City, NJ (US); Chi-Chun Liu, Altamont, NY (US); Kristin Schmidt, Mountain View, CA (US)

(73) Assignees: INTERNATIONAL BUSINESS MACHINES CORPORATION, Armonk, NY (US); TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/426,523

(22) Filed: Feb. 7, 2017

Related U.S. Application Data

(63) Continuation of application No. 15/291,689, filed on Oct. 12, 2016, now Pat. No. 9,632,408.

(51) Int. Cl.
*C03C 15/00* (2006.01)
*G03F 7/00* (2006.01)
(Continued)

(52) U.S. Cl.
CPC ............ *G03F 7/0002* (2013.01); *C30B 1/04* (2013.01); *C30B 29/58* (2013.01);
(Continued)

(58) Field of Classification Search
CPC ..... G03F 7/0002; C09K 13/00; H01L 21/302; H01L 21/31138; C30B 29/58; C30B 33/08; C03B 12/12
(Continued)

(56) References Cited

U.S. PATENT DOCUMENTS 9,632,408 B1 * 4/2017 Cottle .................. C09K 13/00
2013/0244439 A1 * 9/2013 Ghariehali .......... H01L 21/3081
438/703

(Continued)

OTHER PUBLICATIONS

Cottle, et al., Pending U.S. Appl. No. 15/291,689 entitled "Graphoepitaxy Directed Self Assembly," filed Oct. 12, 2016.
(Continued)

*Primary Examiner* — Binh X Tran
(74) *Attorney, Agent, or Firm* — Cantor Colburn LLP; Vazken Alexanian

(57) ABSTRACT

Graphoepitaxy directed self-assembly methods generally include grafting a conformal layer of a polymer brush onto a topographic substrate. A planarization material, which functions as a sacrificial material is coated onto the topographic substrate. The planarization material is etched back to a top surface of the topographic substrate, wherein the etch back removes the polymer brush from the top surfaces of the topographic substrate. The remaining portion of the polymer brush is protected by the remaining planarization material below the top surface of the topographic substrate, which can be removed with a solvent to provide the topographic substrate with a conformal polymer brush below the top surface of the topographic substrate. The substrate is then coated with a block copolymer and annealed to direct self-assembly of the block copolymer. The methods mitigate island and/or hole defect formation.

17 Claims, 4 Drawing Sheets

(51) Int. Cl.
*C30B 1/04* (2006.01)
*C30B 29/58* (2006.01)
*H01L 21/027* (2006.01)
*H01L 21/02* (2006.01)
*H01L 21/311* (2006.01)
*H01L 21/3105* (2006.01)

(52) U.S. Cl.
CPC .... *H01L 21/0271* (2013.01); *H01L 21/02118* (2013.01); *H01L 21/31058* (2013.01); *H01L 21/31133* (2013.01)

(58) Field of Classification Search
USPC .......................................... 216/46, 47, 48, 49
See application file for complete search history.

(56) References Cited

U.S. PATENT DOCUMENTS

| | | | | |
|---|---|---|---|---|
| 2015/0038044 | A1* | 2/2015 | Lee .................. | G02F 1/155 |
| | | | | 445/24 |
| 2016/0122859 | A1* | 5/2016 | Cushen ............. | G03F 7/0002 |
| | | | | 216/49 |
| 2016/0186003 | A1* | 6/2016 | Hustad ............. | C09D 153/00 |
| | | | | 524/317 |
| 2016/0322259 | A1* | 11/2016 | Cheng ............. | H01L 21/823431 |
| 2016/0342089 | A1* | 11/2016 | Ruiz ................ | G03F 7/0002 |
| 2016/0343588 | A1* | 11/2016 | Somervell ......... | G03F 7/0002 |
| 2016/0379837 | A1* | 12/2016 | Cheng .............. | C09D 201/00 |
| | | | | 438/781 |

OTHER PUBLICATIONS

List of IBM Patents or Patent Applications Treated as Related; (Appendix P), Date Filed Feb. 8, 2017; 2 pages.

* cited by examiner

GRAPHOEPITAXY DIRECTED SELF ASSEMBLY

DOMESTIC PRIORITY

This application is a CONTINUATION of U.S. patent application Ser. No. 15/291,689, filed Oct. 12, 2016, now U.S. Pat. No. 9,632,408 B1, the disclosure of which is incorporated by reference herein in its entirety.

BACKGROUND

The present invention generally relates to semiconductor integrated circuits, and more particularly, to methods for mitigating topographic defects in graphoepitaxy directed self-assembly processes.

Block co-polymer (BCP) lithography is becoming an established directed self-assembly technique for patterning beyond optical lithography limitations. It is based on combining the intrinsic property of block co-polymers to phase separate at the molecular scale with the capabilities of conventional top-down lithographic methods for patterning surfaces. Guiding the self-assembly of block co-polymers by surface chemical modification is one of the most used processes to drive the self-assembly in a convenient way. It typically consists of using lithography and oxygen plasma to create different wettability regions on a polymer brush material grafted on the surface.

In the graphoepitaxy directed self-assembly process, the self-organization of block copolymers is guided by topographical guiding patterns such that the block-copolymer self organizes in useful domains, which is dominated by the concept of confinement. Neutral walls or pillars that define the guiding pattern prevent certain chain configurations, which then lead to the polymer to adjust its periodic structures along a pre-determined axis. As a result, graphoepitaxy directed self-assembly provides sub-lithographic, self-assembled features having a smaller characteristic dimension than that of the pre-pattern itself.

SUMMARY

In one or more embodiments, a graphoepitaxy directed self-assembly method includes providing a substrate having a surface with an opening therein, the opening having a boundary that includes a bottom surface, a top surface and sidewalls extending between the top and bottom surfaces. A layer of brush material that includes a functionality reactive with the surface; is applied over the surface. The substrate is heated to a temperature effective to react the functionality with the surface to form a monolayer of the brush polymer material grafted to the surface. Non-grafted brush polymer material is removed with a solvent. A layer of sacrificial material is applied over the grafted monolayer of the brush polymer material, wherein the sacrificial material is not crosslinked. The substrate is etched to the top surface to remove the sacrificial material and the brush material therefrom. The remaining sacrificial material in the opening is removed with a solvent to form a conformal brush layer on the sidewalls and the bottom surface of the opening. A block copolymer is coated onto the substrate and annealed to direct self-assembly of the block copolymer.

In one or more embodiments, a graphoepitaxy directed self-assembly method includes providing a substrate having a surface with an opening therein, the opening having a boundary that includes a bottom surface, a top surface and sidewalls extending between the top and bottom surfaces. A layer of brush polymer material is applied over the surface. The brush polymer material includes a functionality reactive with the surface. The substrate is heated to a temperature effective to react the functionality with the surface to form a monolayer of the brush polymer material grafted to the surface. Non-grafted brush material is removed with a solvent. A first layer of a first sacrificial material is deposited over the grafted monolayer of the brush polymer material, wherein the first sacrificial material is not crosslinked and solvent removable. At least one additional layer of an additional sacrificial material is applied in an orthogonal solvent to the first layer of first sacrificial material. The substrate is etched to the top surface so as to remove the first sacrificial material, the additional sacrificial material and the brush material therefrom. The remaining first sacrificial material is removed in the opening with a solvent to form a conformal brush layer on the sidewalls and the bottom surface of the opening. A block copolymer is coated on the substrate and annealed to direct self-assembly of the block copolymer.

In one or more embodiments, a graphoepitaxy directed self-assembly method includes grafting a conformal layer of a polymer brush onto a topographic substrate. A planarization material is coated onto the topographic substrate. Etching back the planarization material to a top surface of the topographic substrate selectively removes the polymer brush from the top surface. A remaining portion of the polymer brush is protected by the remaining planarization material below the top surface of the topographic substrate. The remaining planarization material is removed with a solvent to provide the topographic substrate with a conformal polymer brush below the top surface of the topographic substrate; and coating a block copolymer onto the substrate and annealing to direct self-assembly of the block copolymer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
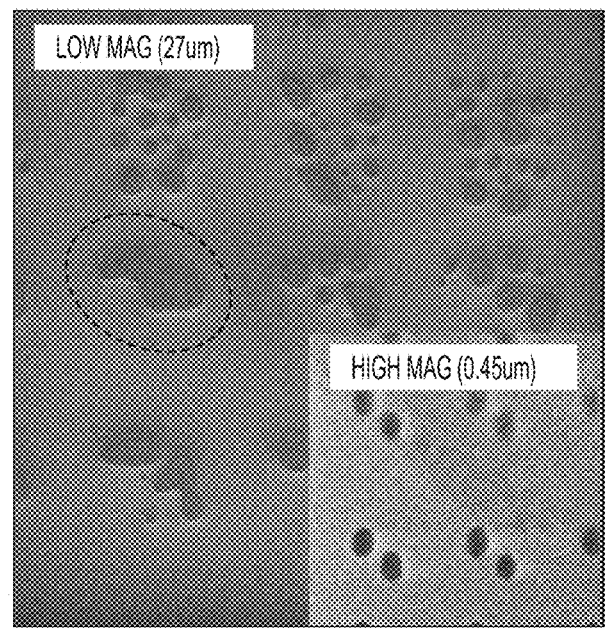
FIG. 1 is a photomicrograph illustrating an island/hole defect observable on a top surface of a guiding pattern of hole at low magnification (27 μm) and the same guiding pattern at markedly higher magnification (0.45 μm)

The detailed description explains the preferred embodiments of the invention, together with advantages and features, by way of example with reference to the drawings.

DETAILED DESCRIPTION

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures.

The same numbers in the various figures can refer to the same structural component or part thereof. The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The present invention is generally directed to methods for mitigating topographic defects associated with using graphoepitaxy directed self-assembly processes. The graphoepitaxy directed self-assembly processes utilize a topographical guiding pattern to direct the self-assembly of block copolymers (BCP). A BCP generally consists of two or more polymeric chains (blocks), which are chemically different and covalently attached to each other. In the melt, they are driven to segregate into a variety of ordered structures by the repulsion of the immiscible blocks, much as in the case of a blend of immiscible homopolymers.

As is generally known, the guiding pattern in general can be configured to be preferential to a selected one of the blocks, which can affect the critical dimension of feature patterned using the guiding pattern. For example, a brush material can be disposed upon a substrate and that can be used to control segregation of the block copolymer. The brush material can be a polymer that includes a reactive moiety that is reacted to a substrate upon which it is disposed, which includes the surfaces defined by the guiding pattern. Hydroxyl-end terminated polystyrene has been used to provide surface modification prior to application and annealing of the block copolymer.

By way of example, the guiding pattern for hole formation can be configured as polymethyl methacrylate (PMMA)-preferential as etched or polystyrene (PS)-preferential when the guiding pattern surface is modified with a suitable brush material such as the hydroxyl-terminated polystyrene noted above, wherein the optimum critical dimension for hole guiding patterns are about 2 times and about 1 times the natural period of a PS-PMMA block copolymer, respectively. Smaller critical dimensions of the hole guiding patterns are generally desired because it allows for printing of higher density vias in one lithography process, which make surface modification with a PS or PS-like brush desirable for smaller critical dimensions. The block copolymer is applied to a substrate such as a trench or contact hole treated with a brush layer. After annealing to form and align the domains, one block is selectively removed with an etch or development process to provide a mask that can be transferred into the substrate to create a nanoscale pattern with smaller features than in the original trench or contact hole containing substrate. Pattern transfer can occur because each block within the block copolymer is selected to provide a different etch selectivity. In one or more embodiments, the etch selectivity between the first block and the second block is at least 2 to 1.

One of the problems with current graphoepitaxy directed self-assembly processes as it relates to the use of brushes is the formation of holes and/or island defects on the top surfaces of the guiding patterns that cause pattern transfer issues. For guiding patterns including PS-preferential sidewalls, for example, the brush material is applied to all of the exposed surfaces including the sidewall, the bottom surface, and the top surface. During the directed self-assembly stage, the PS-preferential top surface will induce parallel BCP defect structures, which are commonly referred to as the hole and/or island morphology. These island/hole defects are readily observable via microscopy because the island/hole is a topographical surface defect. In one or more embodiments, the height difference between islands and/or hole defect structure from the brush monolayer defining the patterned feature is about 1 times the natural periodicity (L0) or about 30 nanometers (nm) in the case of PS brush modification, which will further cause transfer issues.

FIG. 1 provides a micrograph illustrating the island/hole defect readily observable on the top surface of the guiding pattern at low magnification (field of view is 27 μm) and the guiding pattern including vias of the same area at markedly higher magnification (field of view is 0.45 μm). The island/hole behavior generally depends on the film thickness at the top surface, i.e., the mesa area. It has been found that certain pattern densities and processes the PS preferential condition on the mesa generates defect easily while etched SiARC for example, which is PMMA-preferential, does not.

The present invention provides a brush etch back process so as to remove the brush material from the top surfaces of the guiding pattern. Referring now to FIGS. 2-8, there are schematically and sequentially shown a process flow including the brush back process.

Figure 2:
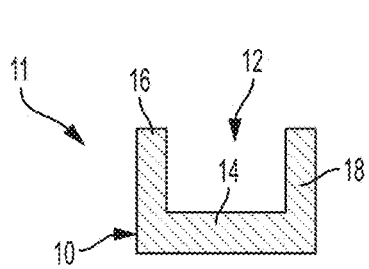
FIG. 2 depicts a schematic cross-sectional view illustrating a guiding pattern of a hole formed in a substrate.

As shown in FIG. 2, process begins with a patterned substrate 10 including an opening 12, e.g., a contact hole, as the guiding pattern 11. The particular guiding pattern 11 includes a bottom surface 14, a top surface 16 and a sidewall 18 extending from the bottom surface 14 to the top surface 16.

By way of example, the opening 12 defining the guiding pattern 11 can formed by optical lithography and etching. The lithographic step can include forming a photoresist (organic, inorganic or hybrid) atop the substrate 10. In one or more embodiments, the photoresist can be formed directly on the upper surface of the substrate 10. In another embodiment, and when a hard mask material (not shown) is present, the photoresist can be formed directly on the upper surface of the hard mask material. The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, an etching step can be performed to transfer the pattern from the patterned photoresist into the substrate 10. In one or more embodiments, and when a hard mask material is present, the pattern can be first transferred into the hard mask material and then into the substrate 10. In such an embodiment, the patterned photoresist is typically, but not necessarily always, removed from the surface of the structure after transferring the pattern into the hard mask material utilizing a resist stripping process such as, for example, ashing. In some examples, the substrate 10 is a carbon-based material such as an OPL. Consequently, the etch process for OPL can act as a resist ashing, so no additional ashing would be needed. The etching step used in forming the at least one opening can include a dry etching process (including, for example, reactive ion etching, ion beam etching, plasma etching or laser ablation), a wet chemical etching process or any combination thereof. In one or more embodiments, reactive ion etching is used to form the opening 12 in the substrate 10.

Figures 3, 4:
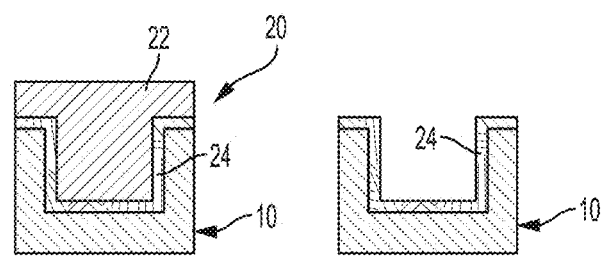
FIG. 3 depicts a schematic cross-sectional view subsequent to deposition of a brush material onto the guiding pattern of FIG. 2, wherein a monolayer of the brush material is grafted to a surface of the substrate.
FIG. 4 depicts a schematic cross-sectional view subsequent to removal of the non-grafted brush material of FIG. 3.

Referring now to FIG. 3, a brush material 20 is coated onto the patterned substrate 10 filling the opening 12 and covering the top surface 16. Upon baking the substrate 10 at an elevated temperature and time, a monolayer 24 of the coated brush material 20 grafts to the exposed surfaces of the patterned substrate 10. The remaining brush material 22 is ungrafted.

The brush material will generally depend on the substrate defining the guiding pattern. By way of example, a hydroxyl-terminated styrene brush polymer material can be used for guiding patterns consisting of silicon dioxide to render the surfaces styrene preferential. The brush material can also be carboxylic acid or amine terminated polystyrene as long as the end-functional group has sufficient reactivity with the targeting substrates. Regarding the composition of the brush polymer, in addition to pure polystyrene, a random copolymer of styrene and other monomers, styrene derivatives (e.g., methyl styrene, t-butyl styrene, and the like), can also be used as long as the resulting polymer has stronger preference to the PS block in BCPs than the PMMA in the BCPs. For example, a brush with 80% styrene content and 20% methyl methacrylate could be used to form a PS-preferential guiding pattern.

In FIG. 4, the ungrafted brush material 22 can be removed from the patterned substrate 10 by a solvent rinse. As a result, the guiding pattern 11 is provided with a highly conformal monolayer of grafted brush material 24 as shown, which includes grafted brush material 24 on the bottom surface 12, the top surface 14 and the sidewalls 16.

Figure 5:
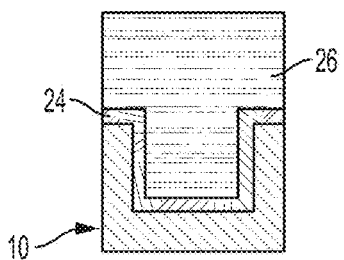
FIG. 5 depicts a schematic cross-sectional view subsequent to deposition of a sacrificial planarization layer onto the grafted brush material of FIG. 4 in accordance with one or more embodiments.

In FIG. 5, a relatively thick sacrificial material 26 is applied to the patterned substrate 10 filling the opening 12 of the guiding pattern 11 and covering the top surface 16. The thickness is not intended to be limited and is generally limited to a thickness effective to provide a planar top surface and provide a uniform coating. The thick sacrificial material 26 is not intended to be limited and is compatible with the grafted brush material. Suitable sacrificial materials are non-crosslinked, have an etch rate similar to the brush material, can be removed by solvent, and leaves no residues on the brush material. Suitable sacrificial materials can include, without limitation, e.g. conventional photoresists, polystyrene homopolymers, polymethyl methacrylate, derivatives thereof, or the like. The sacrificial material 26 can be formed using conventional deposition techniques such chemical vapor deposition, plasma vapor deposition, sputtering, dip coating, spin-on coating, brushing, spraying and other like deposition techniques can be employed e.g., spin coated in a suitable solvent onto the patterned substrate 10 and at a viscosity effective to provide a planar surface thereon.

Figure 6:
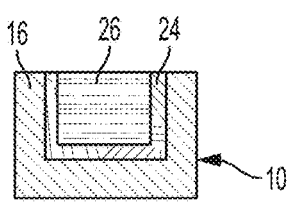
FIG. 6 depicts a schematic cross-sectional view subsequent to etch back of the sacrificial layer to a top surface of the guiding pattern of FIG. 5 in accordance with one or more embodiments.

In FIG. 6, an etch back of the sacrificial material 26 and the brush material 24 on the top surface 16 of the guiding pattern 18 is performed. The etch back of the sacrificial material generally includes a plasma etch process such as a gentle reactive ion etch as is known in the art that will not induce surface roughening or polymer crosslinking, wherein the etch selectivity of the grafted brush material 24 on the top surface 16 is about the same as that of the sacrificial material 26.

Figure 7:
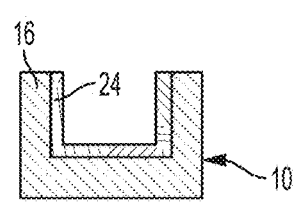
FIG. 7 depicts a schematic cross-sectional view subsequent to solvent removal of the remaining sacrificial layer below the top surface of the guiding pattern of FIG. 6 in accordance with one or more embodiments.

In FIG. 7, the substrate 10 is solvent rinsed to remove the remaining sacrificial material in the opening 12, wherein the grafter brush material remains on the sidewalls 18 and the bottom surface 14 as shown.

Figure 8:
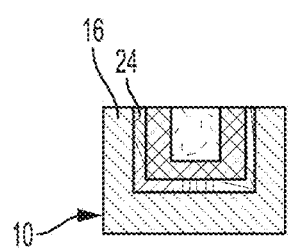
FIG. 8 depicts a schematic cross-sectional view subsequent to coating a block copolymer onto the substrate of FIG. 7 and annealing to direct self-assembly of the block copolymer.

In FIG. 8, the BCP is applied over the opening to the patterned substrate 10 and subsequently annealed to form discrete segregated domains 30, 32 in the opening 12, wherein the centrally located domain 30 can be selectively removed to form holes, which can then be transferred into the underlying substrate. By utilizing the etch back step to remove the PS layer on top of the guiding pattern, suppression of holes and/or island defects is achieved.

Figure 9:
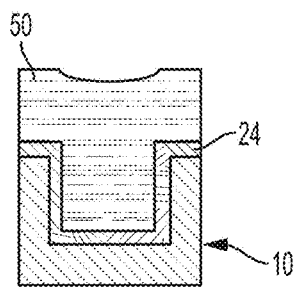
FIG. 9 depicts a schematic cross-sectional view depicts a schematic cross-sectional view subsequent to deposition of a first sacrificial planarization layer onto the grafted brush material of FIG. 4 in accordance with one or more embodiments.
Figure 10:
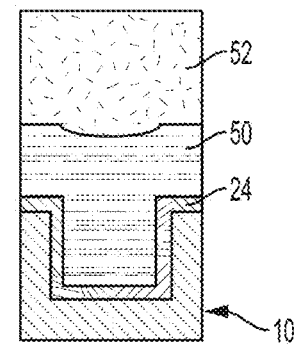
FIG. 10 depicts a schematic cross-sectional view subsequent to deposition of at least one additional sacrificial planarization layer in an orthogonal solvent onto the first sacrificial planarization layer of FIG. 9 in accordance with one or more embodiments.
Figure 11:
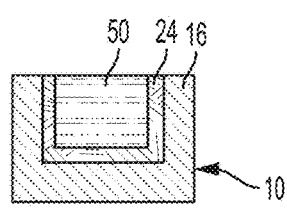
FIG. 11 depicts a schematic cross-sectional view subsequent to coating a block copolymer onto the substrate of FIG. 10 and annealing to direct self-assembly of the block copolymer.

In one or more embodiments, the sacrificial material can be a multilayered structure as shown in FIGS. 9-11, wherein for illustrative purposes, two layers 50, 52 are shown. Referring to FIG. 9, a first layer of sacrificial material 50 can be applied to the patterned substrate 10 filling the opening 12 of the guiding pattern 11 and covering the top surface 16. The sacrificial layer 50 can be applied at a lower viscosity compared to the singularly applied sacrificial layer 26 above to provide better coating uniformity and better reflow property in order to avoid poor gap filling and coating voids. The sacrificial layer 50 is not crosslinked, can be removed by solvent, and leaves no residues on the brush material, all of which help maintain integrity of the brush material.

In FIG. 10, an additional layer of sacrificial material 52 is applied on the first layer of sacrificial material 50. The additional layer of sacrificial material 50 can be different from the first layer of sacrificial material and is applied to the first layer in an orthogonal solvent. As used herein, the term "orthogonal solvent" is hereinafter defined as a solvent that dissolves sacrificial material 52 but does not dissolve the underlying first layer of sacrifice material 50 due to the polarity difference between the orthogonal solvent and the first layer of sacrificial material 50. The process can be repeated multiple times as can be desired in some applications, e.g., then planarization process utilized in fin cuts, which can be composed of three cycles of organic planarizing layer collating and etch backs. Advantageously, the multiple layers of sacrificial material can be deposited at lower viscosities, which can be used to provide better filling of the features.

In one or more embodiments, the additional sacrificial material is a crosslinked polymer such as an organic planarizing layer. If a crosslinkable material is chosen and the two sacrificial materials have finite solubility in each other, the crosslinking temperature of this additional sacrificial material should be lower than the glass transition temperature (Tg) of first sacrificial layer.

By way of example, overcoat material commercially available under the tradename TCX041 from Japan Synthetic Rubber Co, (JSR) is generally used as a barrier film between photoresist and an immersion fluid in an immersion lithography system. JSR TCX041 is formed of an acidic fluorocarbon polymer and can be coated onto polystyrene homopolymer using 4-methyl-2-pentanol as a solvent. 4-methyl-2-pentanol does not dissolve the polystyrene homopolymer.

In FIG. 11, the structure is subjected to the etch back of the sacrificial material 50, 52 and the brush material 24 on the top surface 16 of the guiding pattern 18. The etch back of the sacrificial material generally includes a plasma etch process, wherein the etch selectivity of the grafted brush material 24 on the top surface 16 is about the same as that of the sacrificial materials 50, 52.

Figure 12:
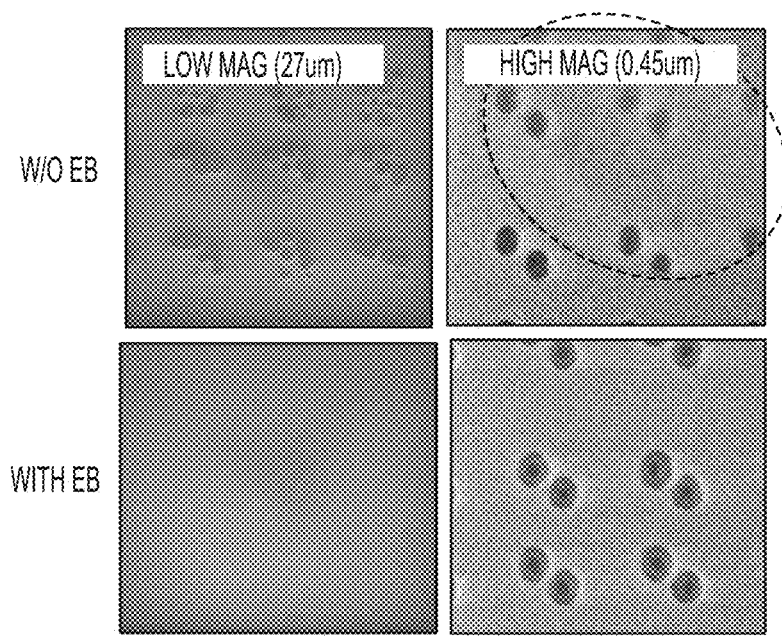
FIG. 12 are photomicrographs of substrates subjected to graphoepitaxy self-directed assembly with deposition of a sacrificial material followed by etch back, and without deposition of the sacrificial material and without etch back at different magnifications.

FIG. 12 provides micrographs at different magnifications illustrating the top surface of a patterned substrate after graphoepitaxy directed self-assembly with a PS-PMMA copolymer. The patterned substrates included a guiding pattern of holes and were processed with and without the etch back process as described above. For the substrate without etch back, directed self-assembly was made subsequent to application of the brush material onto the exposed surfaces of the guiding pattern. For the substrate with etch back, directed self-assembly was made subsequent to etch back and rinsing of a singular 90 nm layer of polystyrene homopolymer as the sacrificial material. As shown, hole and/or island formation is readily apparent in the substrate without etch back whereas proper etch back of a singular layer of PS homopolymer resulted in excellent pattern fidelity.

Figure 13:
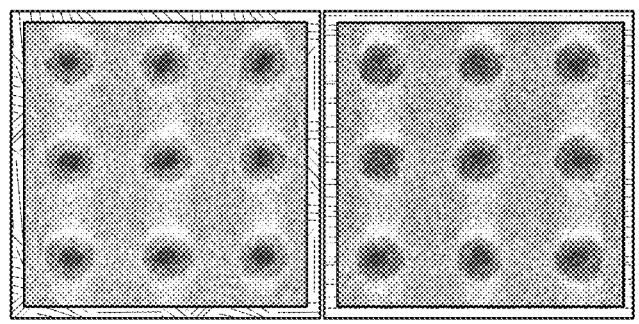
FIG. 13 are photomicrographs of substrates subjected to graphoepitaxy self-directed assembly with etch back at different etch times, wherein over-etch conditions results in removal of brush material from the upper sidewall of the guiding pattern.
Figure 13:
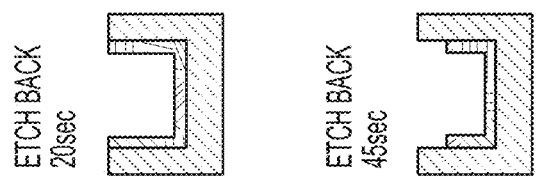

Referring now to FIG. 13, micrographs are depicted of an etch back process directly with the brush material applied to a guiding pattern, i.e., the etch back is timed and directly removes the PS brush in the absence sacrificial material. The timed etch back is at 20 seconds and 45 seconds. As shown, over etching as shown in the micrographs after a timed etch of 45 seconds can result in removal of the PS brush material at about the top portion of the opening, which makes it PMMA preferential and results in a directed self-assembly structure that is a mixture of a plug and hole. This emphasizes the importance of etch optimization but also implies that the planarization itself is critical. Any thickness variation greater than the etch back process window will induce undesired directed self-assembly structures. The use of the sacrificial layer as described above provides much better planarization and potentially better control of etch back times. Because if a higher etch resistant sacrificial material is chosen, the slower etch rate and longer etch time will be achieved, hence, easier to stop the etch within the proper process window.

As noted above, the brush material is a polymer that includes at least one functionality reactive with the substrate defining the guiding pattern. Suitable polymers include, without limitation, a styrenic polymer, a polysiloxane, a polymethylmethacrylate, a polyacrylate, a polyvinylacetate, a polydiene, a polyether, a poly(vinylpyridine), a polyorganogermane, or a combination including at least one of the foregoing polymers.

The block copolymer as used herein is a polymer derived from more than one species of monomer. A block copolymer as used herein is a copolymer that includes more than one species of monomer, wherein the monomers are present in blocks. Each block of the monomer includes repeating sequences of the monomer. A formula (1) representative of a block copolymer is shown below:

$$-(A)_a\text{-}(B)_b\text{-}(C)_c\text{-}(D)_d\text{-} \ldots \text{-}(Z)_z\text{-} \qquad (1),$$

wherein A, B, C, D, through Z represent monomer units and the subscripts "a", "b", "c", "d" through "z", represent the number of repeating units of A, B, C, D through Z, respectively. The above-referenced representative formula is not meant to limit the structure of the block copolymer used in the present invention. The aforementioned monomers of the copolymer can be used individually and in combinations thereof in accordance with the methods of the present invention.

A di-block copolymer has blocks of two different polymers. A formula (2) representative of a di-block copolymer is shown below:

$$-(A)_m\text{-}(B)_n\text{-} \qquad (2),$$

in which the subscripts "m" and "n" represent the number of repeating units of A and B, respectively. The notation for a di-block copolymer can be abbreviated as A-b-B, where A represents the polymer of the first block, B represents the polymer of the second block, and -b- denotes that it is a di-block copolymer of blocks of A and B. For example, PS-b-PMMA represents a di-block copolymer of polystyrene (PS) and polymethylmethacrylate (PMMA). In addition to linear block copolymers, block copolymers with other architecture also can be used for directed self-assembly, e.g., star copolymers, branched copolymers, hyperbranched copolymers, and grafted copolymers.

The blocks can in general be any appropriate microdomain-forming block to which another, dissimilar block can be attached. Blocks can be derived from different polymerizable monomers, where the blocks might include but are not limited to: polyolefins including polydienes, polyethers including poly(alkylene oxides) (such as poly(ethylene oxide), poly(propylene oxide), poly(butylene oxide), or random or block copolymers of these), poly((meth)acrylates), polystyrenes, polyesters, polyorganosiloxanes, polyorganogermanes, and the like.

The blocks of the block copolymer might include as monomers C2-30 olefinic monomers, (meth)acrylate monomers derived from C1-30 alcohols, inorganic-containing monomers including those based on Fe, Si, Ge, Sn, Al, Ti, or a combination including at least one of the foregoing monomers. Monomers for use in the blocks might include, as the C2-30 olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or $\alpha$-methylstyrene. The monomers might include, as (meth)acrylate monomers, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers might be used. Blocks which are homopolymers might include blocks prepared using styrene (e.g., polystyrene blocks), or (meth) acrylate homopolymeric blocks such as poly(methylmethacrylate). Random blocks might include, for example, blocks of styrene and methyl methacrylate (e.g., poly(styrene-co-methyl methacrylate)), randomly copolymerized. An alternating copolymer block might include blocks of styrene and maleic anhydride, which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Furthermore, block copolymers that might be suitable for use in the present methods include diblock or triblock copolymers such as poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination including at least one of the foregoing block copolymers.

The block copolymer desirably has an overall molecular weight and polydispersity amenable to further processing. For example, the block copolymer might have a weight-averaged molecular weight (Mw) of 3,000 to 400,000 g/mol. Similarly, the block copolymer might have a number averaged molecular weight (Mn) of 1,000 to 200,000. The block copolymer might also have a polydispersity (Mw/Mn) of 1.01 to 6, and is not particularly limited thereto, but lower polydispersity is in general more desirable. Molecular weight, both Mw and Mn, can be determined by, for example, gel permeation chromatography using a universal calibration method, calibrated to polystyrene standards.

The block copolymer formulation can be applied by spin coating it onto the substrate, e.g., at a spin speed from about 1 rpm to about 10,000 rpm, with or without a post-drying process. Other processes can be used for applying the block copolymer formulation to the substrate, such as dip-coating and spray-coating.

As used herein, "phase-separate" refers to the propensity of the blocks of the block copolymers to form discrete microphase-separated domains, also referred to as "microdomains" and also simply as "domains". The blocks of the same monomer aggregate to form domains, and the spacing and morphology of domains depends on the interactions, volume fractions, and number of different blocks in the block copolymer. Domains of block copolymers can form spontaneously while applying them to a substrate such as during a spin-casting step, or they can form as a result of an annealing step. "Heating" or "baking" is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" is used to induce phase separation, and in addition, can be used as a process for reducing or removing defects in the layer of lateral microphase-separated domains. It generally involves heating at elevated temperature above the glass transition temperature of the block copolymers, for a period of time (e.g., several minutes to several days).

Solvents that can be used vary with the solubility requirements of the block copolymer components and the various additives, if any. Exemplary casting solvents for these components and additives include propylene glycol monomethyl ether acetate (PGMEA), ethoxyethyl propionate, anisole, ethyl lactate, 2-heptanone, cyclohexanone, amyl acetate, $\gamma$-butyrolactone (GBL), toluene, and the like.

Additives can be selected from the group consisting of: additional polymers (including homopolymers, star polymers and copolymers, hyperbranched polymers, block copolymers, graft copolymers, hyperbranched copolymer, random copolymers, crosslinkable polymers, and inorganic-containing polymers), small molecules, nanoparticles, metal compounds, inorganic-containing molecules, surfactants, photoacid generators, thermal acid generators, base quenchers, hardeners, cross-linkers, chain extenders, and combinations including at least one of the foregoing, wherein one or more of the additives co-assemble with the block copolymer to form part of one or more of the self-assembled domains.

A substrate, as used herein, is physical structure suitable for use with any of the methods described herein, including but not necessarily limited to substrates used in the semiconductor industry. This includes a physical body (e.g., a layer or a laminate, a material, and the like) onto which materials (such as polymers, polymeric materials, metals, oxides, dielectrics, etc.) can be deposited or adhered. The substrates herein can include semiconducting materials, insulating materials, conductive materials, or any combination thereof, including multilayered structures. Thus, for example, a substrate can include a semiconducting material such as Si, SiGe, SiGeC, SiC, GaAs, InAs, InP and other III/V or II/VI compound semiconductors. A substrate can include, for example, a silicon wafer or process wafer such as that produced in various steps of a semiconductor manufacturing process, such as an integrated semiconductor wafer. A substrate can include a layered substrate such as, for example, Si/SiGe, Si/SiC, silicon-on-insulators (SOIs) or silicon germanium-on-insulators (SGOIs). A substrate can include one or more layers such as a dielectric layer, a barrier layer for copper such as SiC, a metal layer such as copper, a hafnium dioxide layer, a silicon layer, a silicon oxide layer, the like, or combinations thereof. A substrate can include an insulating material such as an organic insulator, an inorganic insulator or a combination thereof including multilayers. A substrate can include a conductive material, for example, polycrystalline silicon (polySi), an elemental metal, alloys of elemental metals, a metal silicide, a metal nitride, or combinations thereof, including multilayers. A substrate can include ion implanted areas, such as ion implanted source/drain areas having P-type or N-type diffusions active to the surface of the substrate.

Articles can be prepared using the method described hereinabove. As one example, one or more aspects of the present invention can be included in an article of manufacture, e.g., one or more computer hardware products such as permanent or rewriteable data storage media such as hard disks readable by a machine, employing, for instance, computer usable media. The media has embodied therein, for instance, computer readable program code means for providing and facilitating the capabilities of the present invention. The article of manufacture can be included as a part of a computer system or sold separately. Other exemplary applications include fabrication of semiconductors including microprocessors, ASICs, and/or memory chips including DRAM, SRAM, Flash, and the like.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A graphoepitaxy directed self-assembly method comprising:
grafting a monolayer of a brush polymer material onto a substrate;
applying a layer of sacrificial material over the grafted monolayer of the brush polymer material, wherein the layer of sacrificial material is not crosslinked;
etching the substrate to selectively remove portions of the layers of the sacrificial material and the brush polymer material therefrom;
removing a remaining portion of the layer of sacrificial material with a solvent; and
coating a block copolymer onto the substrate and annealing to direct self-assembly of the block copolymer on a remaining portion of the layer of the brush polymer material.

2. The method of claim 1, wherein the block copolymer comprises a first block comprising a first monomer and a second block comprising a second monomer, wherein an etch selectivity between the first monomer and the second monomer is at least 2 to 1.

3. The method of claim 1, wherein the brush material and the sacrificial material have about equal etch selectivities.

4. The method of claim 1, wherein the brush polymer material includes a reactive moiety that reacts with the substrate upon which it is disposed.

5. The method of claim 1, wherein the brush polymer material comprises a hydroxyl, carboxylic acid, or amine terminated polystyrene, a polysiloxane, a polymethylmethacrylate, a polyacrylate, a polyvinylacetate, a polydiene, a polyether, a poly(vinylpyridine), a polyorganogermane, or a combination comprising at least one of the foregoing polymers.

6. The method of claim 1, wherein the sacrificial material is a photoresist composition.

7. The method of claim 1, wherein the sacrificial material is a homopolymer of a polystyrene or a polystyrene derivative.

8. The method of claim 1, wherein the block copolymer comprises, as monomers, C2-30 olefinic monomers, (meth) acrylate monomers derived from C1-30 alcohols, inorganic-containing monomers including those based on Fe, Si, Ge, Sn, Al, Ti, or a combination comprising at least one of the foregoing monomers.

9. The method of claim 1, wherein the block copolymer comprises poly(styrene-co-methyl methacrylate.

10. A graphoepitaxy directed self-assembly method comprising:
grafting a conformal monolayer of a brush polymer material onto a substrate, wherein the substrate includes topographical features;
applying a first layer of a first sacrificial material over the grafted monolayer of the brush polymer material, wherein the first sacrificial material is not crosslinked and is solvent removable;
applying at least one additional layer of an additional sacrificial material in an orthogonal solvent to the first layer of the first sacrificial material to form a planar top surface;
etching the substrate to selectively remove the layer of the additional sacrificial material, and portions of the layers of the first sacrificial material and the brush polymer material therefrom, wherein the brush polymer material is removed from an upper surface of the substrate;
removing the remaining first sacrificial material in the opening with a solvent to expose the brush polymer material on the sidewalls and the bottom surface of the opening; and
coating a block copolymer onto the substrate and annealing to direct self-assembly of the block copolymer onto the brush polymer material.

11. The method of claim 10, wherein the additional sacrificial material is a crosslinked organic planarizing layer.

12. The method of claim 10, wherein the block copolymer comprises, as monomers, C2-30 olefinic monomers, (meth) acrylate monomers derived from C1-30 alcohols, inorganic-containing monomers including those based on Fe, Si, Ge, Sn, Al, Ti, or a combination comprising at least one of the foregoing monomers.

13. The method of claim 10, wherein the block copolymer comprises a first block comprising a first monomer and a second block comprising a second monomer, wherein an etch selectivity between the first monomer and the second monomer is at least 2 to 1.

14. The method of claim 10, wherein the brush polymer material and the first sacrificial material have about equal etch selectivities.

15. The method of claim 10, wherein the brush material can be a hydroxyl, carboxylic acid, or amine terminated polystyrene.

16. The method of claim 10, wherein the brush polymer material includes a reactive moiety that reacts with the substrate upon which it is disposed.

17. The method of claim 16, wherein the brush material polymer is a polystyrene, a polysiloxane, a polymethylmethacrylate, a polyacrylate, a polyvinylacetate, a polydiene, a polyether, a poly(vinylpyridine), a polyorganogermane, or a combination comprising at least one of the foregoing polymers.

* * * * *